Aug. 12, 1969 R. J. BRAUN 3,461,300

AUTOMATIC GAIN CONTROL CIRCUIT FOR OPTICAL SENSOR

Filed Aug. 31, 1966

INVENTOR
ROLAND J. BRAUN

BY John C. Black
ATTORNEY

United States Patent Office 3,461,300
Patented Aug. 12, 1969

3,461,300
AUTOMATIC GAIN CONTROL CIRCUIT FOR OPTICAL SENSOR

Roland J. Braun, Vestal, N.Y., assignor to International Business Machines Corporation, Armonk, N.Y., a corporation of New York

Filed Aug. 31, 1966, Ser. No. 576,300
Int. Cl. H01j *39/12*
U.S. Cl. 250—219 7 Claims

ABSTRACT OF THE DISCLOSURE

AGC action, especially useful in optical sensing apparatus, is achieved by applying data manifestations, which are in the form of A-C current components superimposed upon a D-C reference current, to a varis'or having a logarithmic current-to-voltage characteristic. The A-C component currents are a fixed percentage of the D-C reference current, thereby producing constant output changes in voltage across the varistor irrespective of the absolute value in the A-C current change.

BACKGROUND OF THE INVENTION

This application relates generally to an improved AGC, i.e. automatic gain control, circuit; and more particularly to an AGC circuit which is characterized by a logarithmic current-to-voltage converter, e.g. a varistor across the signal path within which the AGC function is to be achieved. As will be seen below, the improved AGC circuit is particularly advantageous in data processing applications such as optical sensing apparatus wherein data signals are in a form which lend themselves to extremely simple and effective AGC action.

It is the basic function of an AGC system to produce output signals of substantially uniform amplitude in response to input signals, the amplitudes of which vary widely. As might be expected from the name applied to the circuit, the AGC action is normally accomplished by adjusting the gain of an amplifier automatically so that the average amplitude of the output signals remains nearly constant.

The conventional method of realizing the AGC function is that of transforming the output signals of an amplifier into a D-C, i.e. direct-current, voltage (or current) proportional to the average output signal amplitude. This D-C signal is then used in a negative feedback loop to maintain the average output amplitude substantially uniform. The amplified signal is monitored for a change in its average amplitude and each reduction in the average amplitude causes an increase in the amplifier gain and any increase in the average output amplitude causes a decrease in the amplifier gain.

Many specific implementations of this generalized method of producing AGC action are known. Early in the art, negative feedback was directed to the control grid circuits of vacuum tube amplifiers to control the amplifier gain; and later, emitter current and/or collector voltage gain control techniques were applied to transistor amplifiers to control the gain. In one known application, the use of a nonlinear component, i.e. a forward biased diode, in the feedback loop was suggested for controlling the amplifier gain.

However, all of these suggested solutions have one property in common, i.e. they utilize a regulating or control feedback loop. These methods have two inherent disadvantages: (1) in order to render the AGC action effective a change in the average input signal strength must cause a finite change in the average output signal amplitude; and (2) the response to rapid changes in the average input signal amplitude is relatively slow within the AGC feedback loop. The time constant of the D-C control signal, which is derived from the amplifier output signals, must be several times the width of the A-C signal period to prevent loss of the A-C signals.

The improved AGC circuit of the present application does not rely on feedback or control loops of the type described above. In at least certain applications it will be capable of maintaining substantially constant output signal amplitudes even in the presence of very rapid changes in the average amplitude of the input signals.

Accordingly, it is an object of the present invention to provide an improved AGC circuit which does not rely upon amplifier feedback loops to control the gain of the amplifier.

It is another object to provide an improved AGC circuit which is more accurate and responds to rapid changes in average signal level.

In its broadest form, the improved AGC circuit comprises a circuit means in which a current is produced, which current is characterized by an A-C component, which corresponds to some form of intelligence, and by a D-C component, which is proportional in amplitude to the amplitude of the A-C component. The A-C component is superimposed upon the D-C component and this current is applied to a semiconductor device which acts as a substantially logarithmic current-to-voltage converter, thereby providing an AGC action.

Semiconductor devices which exhibit this characteristic are frequently referred to commercially as "varistors." Varistors are semiconductor devices which exhibit nonlinear characteristics over a wide range of current and voltage values. Varistors are available which have nonlinear-voltage current characteristics approximating the mathematical relationship:

$$V=K\log I+Vx \qquad (1)$$

where:
V is the voltage drop across the varistor,
K is a constant,
I is the current thmrough the varistor, and
V$x$ is the offset voltage of the varistor.

Differentiating Equation 1 yields:

$$\frac{dV}{dI}=K\frac{1}{I}$$

or in practical terms $$\Delta V=K\frac{\Delta I}{I} \qquad (2)$$

where: ΔV is the change in voltage across the varistor in response to a ΔI change in current through the varistor.

It can be seen from Equation 2 that the voltage swing ΔV across the varistor remains constant so long as the ratio of the change in current (the A-C component) ΔI to the reference current (the D-C component) I remains constant. Thus if within the environment wherein the varistor is utilized, the A-C component is always a fixed percentage of the D-C component, this current will produce across the varistor voltage swings of constant amplitude irrespective of the absolute value of the A-C current swings.

This condition, wherein A-C signals corresponding to data are inherently a fixed percentage of the D-C reference current upon which they are superimposed, exists in modern optical scanning apparatus utilized in data processing systems. Two types of optical card readers are commonly known, i.e. one in which data representing marks on cards is sensed by means of a source of light and a photo-sensitive transistor and apparatus in which data representing holes in punched cards are sensed optically by means of a source of light and a photo-sensitive transistor.

In mark sensing apparatus, the photo-sensitive transistor receives from the source light energy of a predetermined intensity to establish a D-C reference current through the transistor. The intensity of the light received by the transistor varies when a card to be sensed enters the system and reflects light from the source toward the transistor. This will change the level of the D-C reference current through the transistor. This change is not detected as data, but merely presence of a card. As the card moves through the apparatus, the black marks corresponding to data on the card causes changes in the intensity of the light applied to the transistor. These changes in intensity produce the A-C current changes in the transistor, these changes being superimposed upon the established D-C reference level. The average intensity of the light received by the transistor and the incident D-C reference current level are subject to wide variations due to several factors. Aging of the light source as well as variations in its voltage supply cause significant reductions in the amount of light emitted. The reflective qualities of the document being scanned contribute significantly to the D-C reference level which is established while a card is passing through the sensing area of the apparatus. Variations in the transmission qualities of the light path can be effected by dust and the like. In addition, the sensitivity of the photo-sensitive transistor can vary with aging and with changing environmental conditions.

Consequentialy, in conventional mark sensing apparatus, variations in the order of fifty to one (50:1) can exist from machine to machine and within a given machine over a long period of time. Yet is is desirable to have a single circuit arrangement which can be utilized without frequent readjustment. Hence an extremely effective AGC circuit will contribute significantly to the reliability of the apparatus and to the minimizing of maintenance.

The above factors which contribute to variations in the D-C level which we will hereinafter refer to as I are accompanied by corresponding changes in the A-C component which we shall hereinafter refer to as ΔI. Thus in apparatus of this type ΔI is always a substantially constant percentage of I, irrespective of their absolute values. The total current, e.g. $I+\Delta I$, will be referred to hereinafter as I*in*, the total current input to the varistor.

Optical hole sensing in punched cards is characterized by many similar factors which contribute to variations in the signal I. However, as in the case of mark sensing apparatus, ΔI maintains itself at a substantially fixed percentage of I under conditions which cause variations in their absolute values.

Accordingly, it is a more specific object of the present invention to provide an improved AGC circuit which is characterized essentially by passing current through a varistor which exhibits a substantially logarithmic voltage-current characteristic to produce across the varistor, voltage changes of substantially constant amplitude in response to current changes which are a fixed percentage of their associated reference current level.

It is another object of the present invention to provide in optical scanning apparatus utilizing a photo-sensitive transistor which produces current characterized by a variable amplitude A-C component superimposed upon a varied D-C component with a substantially constant ratio of the A-C to D-C values, a varistor receiving the current from the transistor and producing voltage swings of constant amplitude corresponding to the variable amplitude A-C components.

Since in the optical scanning apparatus the absolute values of I and ΔI can vary as much as fifty to one, some sort of AGC action becomes a necessity. The mark sensing apparatus must be capable of discriminating between a data mark and erasures or imperfections on the card. These erasures and card imperfections will cause ΔI noise signals generally of the same polarity as the ΔI mark signals; however, they are usually of a lower intensity. However, it can be appreciated that, when the circuit environment results in I being at a relatively high level, then the ΔI noise signals may have been an absolute value which is significantly greater than the absolute value of ΔI mark signals in a circuit environment wherein the absolute value of I is extremely low.

What must be effectively detected or discriminated in apparatus including the improvel AGC circuit is not the absolute values of the data and noise signals, but rather the percentage of the I which is achieved by the data or noise signal ΔI. If, for example, in a preferred embodiment the discrimination level is set at fifteen percent without losing data, the circuit will reject and ΔI noise signal which does not achieve a swing is fifteen percent of the value of I which exists at the time of detection.

It is therefore another object of the present invention to provide a very simple yet effective AGC circuit which permits reliable discrimination between data signals and noise signals even though the absolute value of noise signals under certain conditions will exceeed the absolute values of the data signals under different conditions.

It will be appreciated that the greatest advantage of the improved AGC circuit is derived in apparatus of the type in which a current source exists in which ΔI components are a fixed percentage of the D-C component I. It will be appreciated, however, that the improved circuit can be utilized in apparatus where this relationship does not exist. For example, assume that we have only an A-C current. Means can be provided for producing a D-C current which varies in value as a multiple of variations in the average value of the amplitude of the A-C current. The A-C and D-C currents can then be applied to a varistor for producing A-C voltage swings of substantially constant amplitude across the varistor.

The foregoing and other objects, features and advantages of the invention will be apparent from the following more particular description of preferred embodiments of the invention, as illustrated in the accompanying drawings.

In the drawings:

FIGS. 1*a* and 1*b* illustrate the basic concept of the improved AGC circuit with the varistor being coupled to output circuits in the form of common collector and common emitter transmitter amplifiers, respectively;

Figure 1A:
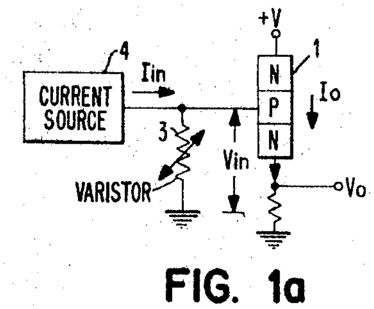
Figure 1B:
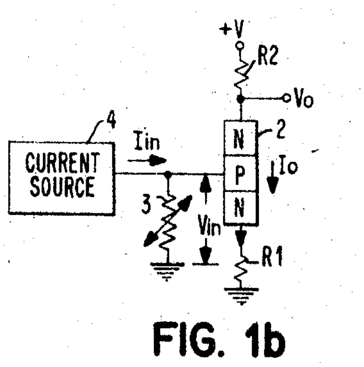

As illustrated in FIGS. 1*a* and 1*b*, the improved AGC circuit includes either a common collector or a common emitter transistor amplifier 1 or 2 with a varistor 3 connecting the base electrode to a reference potential. In each instance, input current I*in* from a source 4 is applied to the varistor and to the amplifier. The base current of the amplifiers is maintained substantially less than the current through the varistor by using high input impedance amplifier configurations. Hence the value of base current is so small with relation to the current through the varistor that it can be disregarded and the assumption made that the varistor current equals the input current I*in*. The source 4 must act as a good current source The current I*in* includes the A-C current ΔI superimposed on the D-C current I and produces a voltage V*in* across the varistor which is a substantially logarithmic function of the input current I*in*.

Figure 2:
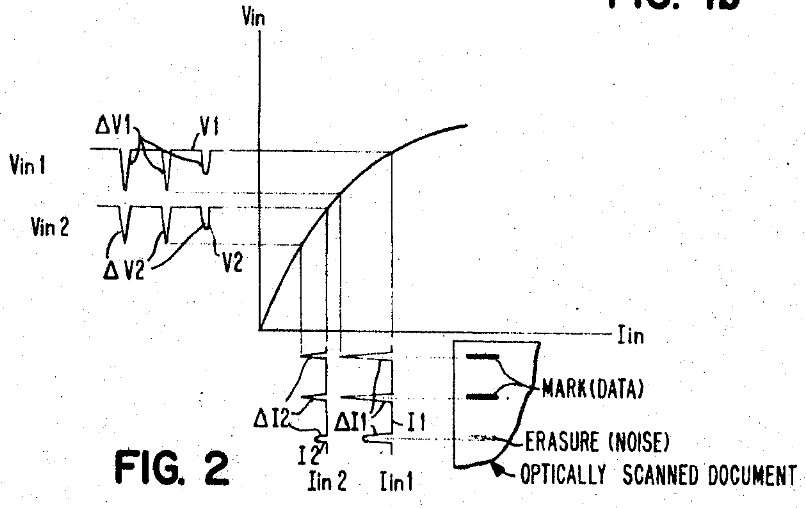
FIG. 2 illustrates graphically the voltage-current characteristic of a varistor which produces the desired AGC action.

FIG. 2 illustrates a mark sense application where the intensity of a light beam is measured, which beam is reflected from a document. It shows a section of a document with two normal marks and one erasure, and also two possible corresponding signal trains I*in*1 and I*in*2. Either one of the two signal trains may be present, depending on the light intensity and/or the sensitivity of the optical sensing device. Similar differences may also be caused by dust accumulation cutting down the effective light intensity or by differences in color or reflectivity of the document. The actual signal train may of course lie between the two shown, or it may assume any value within a forty db range of I. The only requirement is that the value of ΔI for a certain mark remains the same percentage of I for whatever value I may assume. More specifically, FIG. 2 illustrates two input currents I*in*1 and I*in*2 of differing amplitudes which produce two voltages V*in*1 and V*in*2 across the varistor. The reference levels V1 and V2 vary; however the A-C signals ΔV1 and ΔV2 are of the same amplitude. This assumes the relationship:

$$\frac{\Delta I1}{I1}=\frac{\Delta I2}{I2}$$

The amplifiers 1 and 2 are operated in the substantially linear portions of their characteristic curves; and therefore, their output voltages V*o* are also a substantially logarithmic function of the input current I*in*. In spite of the fact that we do not actually control the gain of an active device directly, we still do in fact control the gain of the overall circuit by diverting part of the input signal through the logarithmic device to ground. The overall effect is the same and we still have $$\Delta Io=\Delta Iin\cdot A \text{ with } \Delta Io=\frac{\Delta Vo}{R \text{ load}}$$

where: A, the gain of the amplifier, changes in a way such as to keep ΔI*o* constant.

In FIG. 1*a*, $Vo=Vin-VBE$ where: VBE is the base-emitter voltage drop across the emitter follower 1.

In FIG. 1*b*, $Vo=K\ (Vin-VBE)$ where:

$$K=\frac{R2}{R1}$$

Hence, the output voltage changes ΔV*o* of FIGS. 1*a* and 1*b* are constant if the change in input voltage ΔV*in* is constant.

Figure 3:
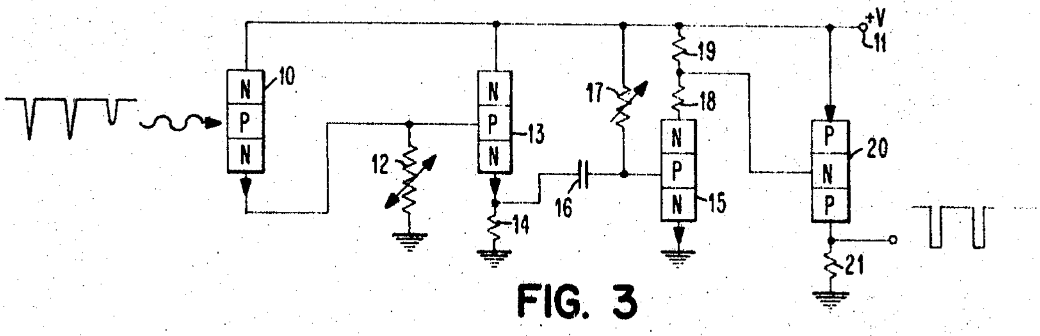
FIG. 3 is a schematic diagram of a preferred form of the invention applied to mark sensing apparatus.

FIG. 3 illustrates a preferred embodiment of the present invention adapted for application to optical mark reading wherein discrete marks (see FIG. 2) are detected by the apparatus as data bits. The preferred embodiment comprises an optical sensor in the form of a photo-sensitive transistor 10 having its collector electrode connected to a positive supply terminal 11 and its emitter electrode connected to ground potential by way of a varistor 12.

Other optical sensors which have a linear light-to-current (or voltage) conversion characteristic (or device which changes resistance linearly with light) may be used. If the sensor has a voltage output, it must be converted to a current source, e.g. by means of a series resistor of high impedance value.

The junction between the transistor 10 and the varistor 12 is connected to the base electrode of a common collector transistor amplifier 13 which has its emitter electrode connected to ground potential by way of a resistor 14. The emitter electrode of the transistor 13 is also coupled to a common emitter transistor amplifier 15 by way of a capacitor 16.

A resistor 17 provides a D-C bias supply for operating the amplifier 15 in saturation and can be in the form of a potentiometer for adjusting a threshold value which must be exceeded by pulses coupled via the capacitor 16 to turn the transistor 15 off. The collector electrode of the transistor 15 is connected to the positive supply terminal 11 by way of a pair of resistors 18 and 19. The junction between the latter resistors is connected to the base electrode of a common emitter transistor amplifier

20 having its emitter electrode connected to the positive supply terminal 11 and its collector electrode connected to ground potential by way of a resistor 21.

The photo-sensitive transistor 10 respond to light reflected from a moving card in the document reading apparatus. Prior to sensing of the first data bit mark, the light reflected from the card onto the transistor 10 will establish a predetermined reference current I through the transistor 10.

The reference current established in the transistor 10 passes almost entirely through the varistor 12 with only a very small amount flowing into the base of the transistor 13. This current through the varistor 12 establishes a reference voltage across the base-emitter junction of the transistor 13, and this reference voltage less the base-emitter drop of the transistor 13 appears at the emitter elecrode.

Each mark which corresponds to a data bit produces a variation in the intensity of the light applied to the base electrode of transistor 10. This variation in light intensity in turn produces a corresponding variation in the current level through the transistor 10. The resulting change in the input current to the varistor 12 and the amplifier 13 produces a variation ΔV*o* in voltage V*o* at the emitter electrode of the latter amplifier.

This voltage change ΔV*o* is applied by the capacitor 16 to the base electrode of the amplifier 15. If the variation ΔV*o* equals or exceeds a predetermined value, the transistor 15 is turned off.

In a typical commercial application, it is expected that the uniformity of the marks will vary; and a minimum standard mark will be established. For varying environmental conditions, the minimum mark will produce a ΔV*o* which is within ten percent of the value which would be produced by the minimum mark in a completely accurate optical and electronic environment. Nonlinearity in the electronic and optical systems and deviation of the varistor curve from a perfect logarithmic function cause this inaccuracy.

This minimum standard marks should produce a ΔI which is a fixed percentage (e.g. fifteen percent) of the reference current I.

The bias setting of the amplifier 15 is, therefore, set for detecting voltage changes ΔV*o* which are produced by current changes ΔI which are equal to or greater than thirteen and five-tenths percent (i.e. ninety percent of fifteen percent) of the reference current I. Therefore, all marks producing a fifteen percent ratio or greater will be detected; and marks or noise producing less than a thirteen and five-tenths percent ratio will be rejected.

In one physical realization, the circuit of FIG. 3 distinguished minimum marks from erasures which produces a ΔI less than thirteen and five-tenths percent of the reference current I over an I*in* range of twenty-five microamperes to one and twenty-five hundredths milliamperes, that is, a range of one to fifty, ΔV*o* remaining constant within ten percent for minimum marks over the input current range of one to fifty.

The embodiment of FIG. 3 can be adapted with slight modification for use in punched hole scanning apparatus. However, the time constant of the circuit must be increased for maintaining the reference levels I and V, which reference level is now produced during the scanning of holes. This can be achieved by suitably increasing the value of capacitor 16 to achieve a long time constant.

Figure 4:
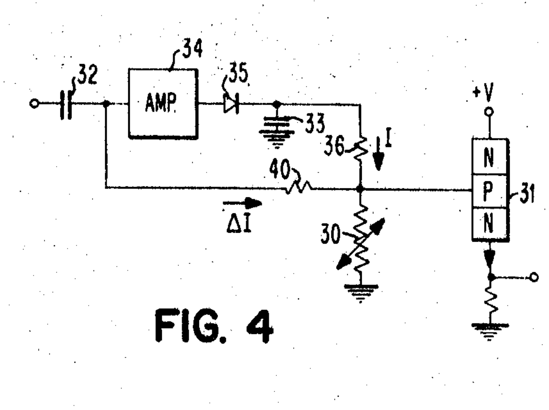
FIG. 4 illustrates the use of the improved AGC circuit in an environment wherein a D-C current-producing means must be provided to achieve AGC action.

FIG. 4 illustrates a preferred form of the present invention in an environment within which the source of input signals does not include a means which inherently produces a reference current I for the varistor. Thus a suitable means for obtaining the reference current I must be provided to achieve the desired AGC action.

The improved circuit of FIG. 4 includes a varistor 30 connected across the input circuit of a common collector transistor amplifier 31. Input signals from a source of A-C current (not shown) are coupled to the varistor and to the base electrode of the amplifier by means of a capacitor 32 and a resistor 40. An amplifier 34 and a diode rectifier 35 couple the input signals to a filter capacitor 33. The capacitor is coupled to the varistor 30 by means of a high impedance resistor 42.

Assuming alternating-current signals from the source are applied to the circuit of FIG. 4, the capacitor 33 will be charged to a level which is a direct function of the average amplitude of the input signals. The voltage across the capacitor, together with the resistor 36, provide for the varistor a D-C reference current which is a direct function of the average amplitude of the incoming signals. As the incoming signals increase or decrease in amplitude, the reference current into the varistor will proportionately increase or decrease. The reference voltage across the varistor will vary as a logarithmic function of this reference current. The incoming A-C current is also applied to the varistor by way of the coupling capacitor 32 and the resistor 40. The A-C current signals are converted by the varistor into A-C voltage signals, the amplitude of which is substantially constant so long as the changes in the average amplitude of the A-C current are not too rapid.

The emitter follower 31 produces substantially constant output voltage swings equal in value to the voltage swings across the varistor but at a lower reference level due to the base-emitter voltage drop.

In the embodiment of FIG. 4, the amplifier 34 is not required if the level of the input signals is sufficiently high to assure proper charging of the capacitor 33 by way of the diode 35. The path including resistor 40 can include means to delay the A–C current to compensate for the delay in the rectifier filter path.

It will be appreciated that the improved AGC circuit can be effectively utilized in optical character recognition systems.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In apparatus having a source of current which is characterized by a direct-current component and by an alternating-current component superimposed on the direct-current component, the amplitudes of both current components being variable over a wide range of values with a substantially constant ratio of the amplitude of alternating-current component to the amplitude of the direct-current component, the combination with the source of current of an automatic gain control circuit comprising a varistor having a substantially logarithmic current-to-voltage characteristic, means coupling the source of current to the varistor to produce voltage variations of substantially constant amplitude in response to alternating-current components of varying amplitude, and a high input impedance transistor amplifier having input terminals coupled across the varistor for producing at its output, amplified constant amplitude output variations corresponding to the alternating-current components.

2. The combination set forth in claim 1 wherein the amplifier is in the form of an emitter follower, and wherein the source of current includes noise signals in the form of alternating-current components, the maximum amplitudes of which are a lower percentage of the direct-current amplitude than that of the first-mentioned alternating-current components;

said combination further comprising a threshold detector responsive to emitter follower output variations equal to or exceeding the amplitude of said constant amplitude output variations and rejecting lower amplitude variations.

3. The combination set forth in claim 1 wherein the source of current includes noise signals in the form of alternating-current components, the maximum amplitudes of which are a lower percentage of the direct-current amplitude than that of the first-mentioned alternating-current components;

said combination further comprising a threshold detector responsive to the amplifier output variations equal to or exceeding the amplitude of said constant amplitude output variations and rejecting lower amplitude variations.

4. The combination set forth in claim 2 wherein the threshold detector comprises a grounded emitter transistor amplifier including a base electrode, a capacitor coupling the base electrode to the emitter follower output, and means including a resistor connected to the base electrode normally operating the grounded emitter transistor amplifier in saturation, said constant amplitude output variations from the emitter follower being of a level and polarity so as to cut off the grounded emitter transistor amplifier.

5. An automatic gain control circuit for a source of variable amplitude alternating current comprising means coupled to the source for producing a source of direct current having a value which is substantially a constant multiple of the average amplitude of the alternating current, a varistor having an approximately logarithmic current-to-voltage characteristic, means coupling both the alternating and direct currents to the varistor to produce across the varistor substantially constant amplitude voltage swings in response to variable amplitude current swings, a high input impedance transistor amplifier having input terminals coupled across the varistor for producing at its output, amplified constant amplitude output variations corresponding to the alternating-current components.

6. In optical mark sensing apparatus of the type in which means including an optical sensing device produces a reference current corresponding to the intensity of the light reflected from a document in the absence of a mark and, superimposed on the reference current, variations in current corresponding to variations in the intensity of the light reflected from the document during the scanning of marks, in combination with the optical sensing device of a varistor having a substantially logarithmic current-voltage characteristic responsive to the reference current and to the superimposed current variations for producing across the varistor variations in voltage corresponding to the variations in current, which variations in voltage are of a substantially constant amplitude so long as the ratio of the amplitude of each variation in current to the amplitude of the reference current which exists at the moment the variation occurs remains substantially constant, a high input impedance transistor amplifier having input terminals coupled across the varistor for producing at its output, amplified constant amplitude output variations corresponding to the superimposed current variations, and a threshold detector responsive to the amplifier output variations equal to or exceeding the amplitude of said constant amplitude output variations and rejecting lower amplitude variations.

7. In optical sensing apparatus of the type in which means including an optical sensing device produces a reference current and, superimposed on the reference current, variations in current in response to the scanning of a document having data recorded thereon, the combination with the optical sensing device of a varistor having a substantially logarithmic current-voltage characteristic responsive to the reference current and to the superimposed current variations for producing across the varistor variations in voltage corresponding to the variations in current, which variations in voltage are of a substantially constant amplitude so long as the ratio of the amplitude of each variation in current to the amplitude of the reference current, which exists at the moment the variation occurs, remains substantially constant, a high input impedance transistor amplifier having input terminals coupled across the varistor for producing at its output, amplified constant amplitude output variations corresponding to the superimposed current variations, and a threshold detector responsive to the amplifier output variations equal to or exceeding the amplitude of said constant amplitude output variations and rejecting lower amplitude variations.

References Cited

UNITED STATES PATENTS

| | | | |
|---|---|---|---|
| 2,982,860 | 5/1961 | Nehrbas et al. | 250—207 |
| 3,214,594 | 10/1965 | Thomson | 250—214 |
| 3,293,505 | 12/1966 | Miller | 307—237 |

OTHER REFERENCES

Kline: IBM Technical Disclosure Bulletin; vol. 8; No. 9; February 1966; pp. 1294, 1295.

WALTER STOLWEIN, Primary Examiner

U.S. Cl. X.R.

250—214; 307—311; 330—33